United States Patent
Tabei et al.

(10) Patent No.: US 7,323,250 B2
(45) Date of Patent: Jan. 29, 2008

(54) CURABLE SILICONE RESIN COMPOSITION, SEALING MATERIAL FOR OPTICAL SEMICONDUCTOR, AND OPTICAL SEMICONDUCTOR DEVICE

(75) Inventors: Eiichi Tabei, Annaka (JP); Kei Miyoshi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 159 days.

(21) Appl. No.: 11/087,599

(22) Filed: Mar. 24, 2005

(65) Prior Publication Data
US 2005/0213926 A1    Sep. 29, 2005

(30) Foreign Application Priority Data
Mar. 25, 2004  (JP) .............. 2004-089321

(51) Int. Cl.
*B32B 9/04* (2006.01)
*C08L 83/04* (2006.01)

(52) U.S. Cl. .............. 428/447; 525/477; 525/478; 528/15; 528/31; 528/32; 524/99; 524/323; 524/351; 524/588

(58) Field of Classification Search .......... None
See application file for complete search history.

(56) References Cited

U.S. PATENT DOCUMENTS

| | | |
|---|---|---|
| 5,998,925 A | 12/1999 | Shimizu et al. |
| 6,815,076 B2 * | 11/2004 | Aoki ............ 428/448 |
| 2004/0157064 A1 * | 8/2004 | Aoki ............ 428/447 |
| 2004/0214966 A1 | 10/2004 | Tabei et al. |
| 2004/0236010 A1 * | 11/2004 | Carter et al. ....... 524/588 |
| 2005/0038221 A1 | 2/2005 | Tabei et al. |
| 2005/0061437 A1 | 3/2005 | Goto et al. |
| 2005/0080154 A1 * | 4/2005 | Tabei ............ 522/148 |

FOREIGN PATENT DOCUMENTS

| | | |
|---|---|---|
| JP | 10-228249 | 8/1998 |
| JP | 2004-190013 | * 7/2004 |

OTHER PUBLICATIONS

Examination Report issued by the Intellectual Property Office of New Zealand for corresponding Patent Application No. 535587.

* cited by examiner

*Primary Examiner*—Marc S. Zimmer
(74) *Attorney, Agent, or Firm*—Oblon, Spivak, McClelland, Maier & Neustadt, P.C.

(57) ABSTRACT

Provided is a curable silicone resin composition including (A) a siloxane-based compound containing at least 2 addition reactive carbon-carbon double bonds within each molecule, (B) a siloxane-based compound containing at least 2 hydrogen atoms bonded to silicon atoms within each molecule, (C) a hydrosilylation reaction catalyst, (D) a phenol-based antioxidant, and (E) a hindered amine compound. Also provided are an optical semiconductor sealing material including such a composition, and an optical semiconductor device that has been sealed with such a composition. The curable silicone composition generates a cured product with high hardness and strength, excellent transparency, and excellent light transmittance and photostability particularly in the short wavelength region.

18 Claims, No Drawings

CURABLE SILICONE RESIN COMPOSITION, SEALING MATERIAL FOR OPTICAL SEMICONDUCTOR, AND OPTICAL SEMICONDUCTOR DEVICE

BACKGROUND OF THE INVENTION

1. Field of the Invention

The present invention relates to a curable silicone resin composition that is useful as a sealing material for optical semiconductors, as well as a sealing material for optical semiconductors comprising such a composition, and an optical semiconductor device that has been sealed with a cured product of such a composition.

2. Description of the Prior Art

Examples of known conventional optical semiconductors include light receiving elements such as the various photodiodes and phototransistors used as optical sensors, and light emitting diodes (LED), and epoxy resins are typically used as the sealing material for these optical semiconductors. Tests have also been conducted on the use of silicone resins as sealing materials (see patent reference 1 and patent reference 2), although examples of practical application of such resins are rare.

In recent years, white LEDs have been attracting considerable attention, and there is a trend towards the use of LEDs that emit light at shorter wavelengths. Meanwhile there is also a trend towards increased use of light receiving elements that use high energy laser light as a detection target. In this environment, resolving the problems associated with epoxy resin sealing materials, such as a deterioration in the transparency, or coloring such as yellowing, caused by continuous or long-term transmittance of ultraviolet light or the like, has become critical. As a result, silicone resins that produce cured products with excellent ultraviolet light transmittance are being investigated as potential alternative sealing materials to conventional epoxy resins. However, with conventional silicone resins, it has proven very difficult to satisfactorily prevent the deterioration of the optical characteristics over time, meaning practical application of these materials has been impossible.

On the other hand, it is generally well known that adding a combination of a phenol-based antioxidant and a photostabilizer to a thermoplastic resin improves the heat resistance, the photostability and the weather resistance of the resin. Furthermore, investigations are also being conducted into improving the weather resistance by adding a combination of a phenol-based antioxidant and a hindered amine compound to a plastic such as polypropylene (see non-patent reference 1).

[Patent Reference 1] JP10-228249A.
[Patent Reference 2] U.S. Pat. No. 5,998,925.
[Non-Patent Reference 1] Up-to-date Technology of Polymer Additives (CMC Publishing Co., Ltd., 1988).

SUMMARY OF THE INVENTION

In light of the problems associated with conventional optical semiconductor sealing materials described above, an object of the present invention is to provide a curable silicone resin composition that generates a cured product with favorable hardness and strength, and excellent photostability. Another object of the present invention is to provide an optical semiconductor sealing material comprising such a composition, and an optical semiconductor device that has been sealed with a cured product of such a composition.

As a result of intensive investigations aimed at achieving the above object, the present inventors were able to complete the present invention.

In other words, the present invention provides a curable silicone resin composition comprising:
(A) a siloxane-based compound containing at least 2 addition reactive carbon-carbon double bonds within each molecule,
(B) a siloxane-based compound containing at least 2 hydrogen atoms bonded to silicon atoms within each molecule,
(C) a hydrosilylation reaction catalyst,
(D) a phenol-based antioxidant, and
(E) a hindered amine compound.

In addition, the present invention also provides an optical semiconductor sealing material comprising the above curable silicone resin composition, and an optical semiconductor that has been sealed using the composition.

A curable silicone resin composition of the present invention is able to generate a cured product with high levels of hardness and strength, and excellent photostability relative to light in the short wavelength region. Accordingly, the composition can be favorably used as an optical semiconductor sealing material in applications such as the protection, sealing, adhesion, or wavelength modification or adjustment of light receiving elements and light emitting diodes, or for lenses.

DETAILED DESCRIPTION OF THE PREFERRED EMBODIMENTS

As follows is a more detailed description of the present invention.

[Component (A)]

A component (A) of the present invention is a siloxane-based compound containing at least 2 addition reactive carbon-carbon double bonds within each molecule.

The term "addition reactive" refers to the ability to undergo addition via a hydrosilylation reaction with a hydrogen atom bonded to a silicon atom (hereafter referred to as "SiH"). Examples of "addition reactive carbon-carbon double bonds" include alkenyl groups such as vinyl groups and allyl groups; as well as carbon-carbon double bonds within vinylene groups (—CH=CH—) or the like that form alicyclic hydrocarbon rings.

There are no particular restrictions on this component (A), and suitable examples thereof include the alkenyl group-containing organopolysiloxanes typically used in this technical field as primary components within well known addition reaction curable silicone resin compositions.

Furthermore, other examples include the phenyl group-containing siloxane-based compounds represented by an average composition formula (1) shown below:

{wherein, each $R^1$ group represents, independently, a substituted or unsubstituted monovalent hydrocarbon group other than a phenyl group, preferably of 1 to 12, and more preferably of 1 to 6, carbon atoms, a group represented by a formula $R^2O$— (wherein, $R^2$ is a substituted or unsubstituted monovalent hydrocarbon group, preferably of 1 to 12, and more preferably of 1 to 6, carbon atoms), or a hydroxyl group, although from 0.1 to 80 mol %, and preferably from 0.3 to 70 mol %, of all $R^1$ groups are alkenyl groups, m represents a number from 0.1 to 1.8, and preferably from 0.2 to 1.6, and n represents a number from 0.2 to 1.9, and preferably from 0.25 to 1.7, although $1 \leq m+n < 2$ and preferably 1.1≦m+n≦1.9, and 0.20≦n/(m+n)≦0.95 and preferably 0.3≦n/(m+n)≦0.85}. The use of this type of phenyl group-containing siloxane-based compound enables the generation of a cured product with excellent light transmittance from a composition of the present invention, and is consequently preferred.

In those cases where $R^1$ represents a substituted or unsubstituted monovalent hydrocarbon group other than a phenyl group, suitable examples of the group include alkyl groups such as a methyl group, ethyl group, propyl group, isopropyl group, butyl group, tert-butyl group, pentyl group, isopentyl group, hexyl group, or sec-hexyl group; cycloalkyl groups such as a cyclopentyl group or cyclohexyl group; aryl groups other than a phenyl group such as an o-, m-, or p-tolyl group, or a xylyl group; aralkyl groups such as a benzyl group or 2-phenylethyl group; alkenyl groups such as a vinyl group, allyl group, propenyl group, butenyl group, pentenyl group, or hexenyl group; or groups in which one or more hydrogen atoms bonded to carbon atoms within one of the above groups have been substituted with halogen atoms or cyano groups or the like, including halogenated alkyl groups such as a chloromethyl group, 3-chloropropyl group, or 3,3,3-trifluoropropyl group; and a 2-cyanoethyl group. Of these, a vinyl group is preferred as an alkenyl group, and a methyl group is preferred amongst the other groups.

Suitable examples of the $R^2$ group include the same groups presented above as examples for when the $R^1$ group represents a substituted or unsubstituted monovalent hydrocarbon group other than a phenyl group, as well as a phenyl group. Furthermore, specific examples of the group represented by the formula $R^2O$— include alkoxy groups such as a methoxy group, ethoxy group, propoxy group, isopropoxy group, butoxy group, or isobutoxy group; aryloxy groups such as a phenoxy group; as well as groups in which a hydrogen atom bonded to a carbon atom within one of the above groups has been substituted with an alkoxy group or a hydroxyl group or the like, such as a methoxyethoxy group or hydroxyethoxy group. Of these, a methoxy group or ethoxy group are preferred.

Examples of siloxane-based compounds of the above average composition formula (1) containing phenyl groups and alkenyl groups include organopolysiloxanes with partially branched chain structures, branched structures, or three dimensional network-type structures. The viscosity (this corresponds with the polymerization degree) of the organopolysiloxane varies depending on the structure, and is typically within a range from 100 to 100,000 mPa·s at 25° C., although may exceed 100,000 mPa·s, particularly in the case of three dimensional network-type structures.

These organopolysiloxanes containing phenyl groups and alkenyl groups can be produced by the cohydrolysis-condensation of appropriate quantities of silane compounds containing a hydrolysable group, including trifunctional silanes such as phenyltrichlorosilane, vinyltrichlorosilane, or methyltrichlorosilane, bifunctional silanes such as methylvinyldichlorosilane, methylphenyldichlorosilane, or dimethyldichlorosilane, and where necessary tetrafunctional silanes such as tetrachlorosilane, in the presence of either an acid such as hydrochloric acid, or a base such as sodium hydroxide. The reaction conditions for this cohydrolysis-condensation are conventionally well known within that technical field. Furthermore, by adjusting the conditions, an organopolysiloxane containing a hydroxyl group bonded to a silicon atom (a silanol group) can also be produced.

The component (A) may be used either singularly, or in combinations of two or more.

[Component (B)]

A component (B) of the composition of the present invention is a siloxane-based compound containing at least 2 SiH groups, which are capable of undergoing addition via a hydrosilylation reaction with the aforementioned component (A), within each molecule.

Suitable examples of this component (B) include, for example, (B1) an organohydrogenpolysiloxane, and (B2) an addition reaction product of 5-vinylbicyclo[2.2.1]hept-2-ene, 6-vinylbicyclo[2.2.1]hept-2-ene, or a mixture thereof, with a cyclic siloxane compound containing from 3 to 10 SiH groups within each molecule.

Examples of the organohydrogenpolysiloxane of the component (B1) include compounds containing at least 2 SiH groups within each molecule, and represented by an average composition formula (2) shown below:

$$R^3{}_aH_bSiO_{[(4-a-b)/2]} \qquad (2)$$

{wherein, each $R^3$ group represents, independently, a substituted or unsubstituted monovalent hydrocarbon group other than an aliphatic unsaturated hydrocarbon group, preferably of 1 to 12, and more preferably of 1 to 6, carbon atoms, a represents a number from 0.5 to 2.1, and preferably from 0.7 to 2.0, b represents a number from 0.01 to 1.0, and preferably from 0.02 to 1.0, and the sum of a and b represents a number from 0.8 to 2.6, and preferably from 1.01 to 2.4}.

Suitable examples of the $R^3$ group include the same groups presented above as examples for when the $R^1$ group represents a substituted or unsubstituted monovalent hydrocarbon group other than a phenyl group, but excluding the alkenyl groups, and including phenyl groups. Of these, a methyl group and a phenyl group are preferred, and a methyl group is particularly desirable.

Examples of the component (B1) include organopolysiloxanes with chain-like structures, partially branched chain structures, or cyclic structures, and specific examples include chain-like polysiloxanes such as methylhydrogenpolysiloxane with both molecular chain terminals blocked with trimethylsiloxy groups, copolymers of dimethylsiloxane and methylhydrogensiloxane with both molecular chain terminals blocked with trimethylsiloxy groups, copolymers of dimethylsiloxane, methylhydrogensiloxane and methylphenylsiloxane with both molecular chain terminals blocked with trimethylsiloxy groups, dimethylpolysiloxane with both molecular chain terminals blocked with dimethylhydrogensiloxy groups, copolymers of dimethylsiloxane and methylhydrogensiloxane with both molecular chain terminals blocked with dimethylhydrogensiloxy groups, copolymers of dimethylsiloxane and methylphenylsiloxane with both molecular chain terminals blocked with dimethylhydrogensiloxy groups, and methylphenylpolysiloxane with both molecular chain terminals blocked with dimethylhydrogensiloxy groups; and cyclic polysiloxanes such as 1,3,5,7-tetramethylcyclotetrasiloxane, and 1,3,5,7,9-pentamethylcyclopentasiloxane.

This component (B1) may be used either singularly, or in combinations of two or more.

The aforementioned component (B2) is an addition reaction product of 5-vinylbicyclo[2.2.1]hept-2-ene, represented by the structural formula (1) shown below

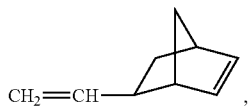

(1)

6-vinylbicyclo[2.2.1]hept-2-ene, represented by the structural formula (2) shown below

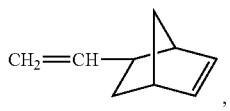

(2)

or a mixture thereof (hereafter, no distinction is made between these options, and the generic term "vinylnorbornene" is used), with a cyclic siloxane compound containing from 3 to 10 SiH groups within each molecule.

Examples of the cyclic siloxane compound include the cyclic siloxane compounds represented by the structural formula (3) shown below:

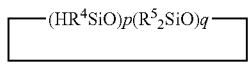

(wherein, $R^4$ and $R^5$ each represent, independently, a hydrogen atom, or an unsubstituted or substituted monovalent hydrocarbon group of 1 to 12, and preferably from 1 to 6, carbon atoms, p represents an integer from 3 to 10, and preferably from 3 to 8, q represents an integer from 0 to 7, and preferably from 0 to 2, and the sum of p and q represents an integer from 3 to 10, and preferably from 3 to 6).

Suitable examples of the groups $R^4$ and $R^5$ in those cases where these groups are not hydrogen atoms include the same groups as those presented in relation to $R^3$, and of these, non-alkenyl groups are preferred, and methyl groups are particularly desirable.

Specific examples of these cyclic siloxane compounds include 1,3,5,7-tetramethylcyclotetrasiloxane and 1,3,5,7,9-pentamethylcyclopentasiloxane, and these compounds can be used either singularly, or in combinations of two or more different compounds.

The component (B2) can be prepared with at least 2 SiH groups within each molecule by adjusting the quantity of the above cyclic siloxane compound to a value within a range from 0.5 to 2 mols, and preferably from 1 to 1.5 mols, and particularly preferably from 1.1 to 1.3 mols, per 1 mol of vinylnorbornene, and then conducting the addition reaction in the presence of a hydrosilylation reaction catalyst described below.

Specific examples of the component (B2) are shown below, although the component (B2) is not limited to these compounds. In the following structures, "Me" represents a methyl group.

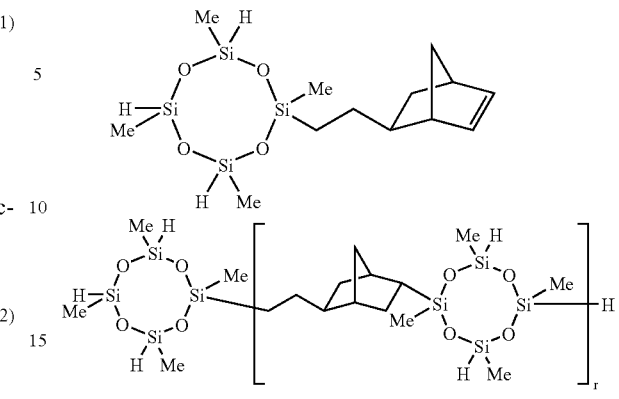

(wherein, r represents an integer from 1 to 11)

This component (B2) may be used either singularly, or in combinations of two or more.

Furthermore, the component (B) may be used either singularly, or in combinations of two or more.

The blend quantity of this component (B) is preferably set so that the quantity of SiH groups within the component (B) is typically within a range from 0.3 to 3.0 mols, and preferably from 0.5 to 2.0 mols, per 1 mol of addition reactive carbon-carbon double bonds within the component (A). By ensuring a blend quantity within this range, a cured product that displays sufficient hardness required for application as a sealing material can be produced from the composition of the present invention.

In those cases where an optionally added component (F) described below, comprising a silicon-based compound containing a SiH group, a silicon-based compound containing an addition reactive carbon-carbon double bond, or a mixture thereof, which is different from the components (A) and (B), is added to the composition, then in a similar manner to that described above, the total quantity of SiH groups within the composition, relative to each mol of the combined total of all addition reactive carbon-carbon double bonds within the composition, is typically within a range from 0.3 to 3.0 mols, and is preferably from 0.5 to 2.0 mols.

[Component (C)]

As the hydrosilylation reaction catalyst that represents the component (C) of a composition of the present invention, any of the conventionally known products can be used. Suitable examples include platinum-based catalysts such as platinum black, platinum (IV) chloride, chloroplatinic acid, reaction products of chloroplatinic acid and monovalent alcohols, complexes of chloroplatinic acid and olefins, and bis(acetylacetonato) platinum: Pt{—OCMe=CH—CO—Me}$_2$; as well as other platinum group metal catalysts such as palladium-based catalysts and rhodium-based catalysts.

There are no particular restrictions on the blend quantity of this component (C), and any effective catalytic quantity is adequate, although a typical quantity, calculated as the mass of platinum group metal atoms relative to the combined mass of the component (A) and the component (B), is from 1 to 500 ppm, and particularly preferably from 2 to 100 ppm. By ensuring a blend quantity within this range, the time required for the curing reaction is suitably short, and problems such as coloring of the cured product do not arise.

[Component (D)]

As the phenol-based antioxidant of the component (D) of a composition of the present invention, any of the conventionally known compounds can be used. Specific examples include 2,6-di-t-butyl-4-methylphenol, 2,5-di-t-amylhydroquinone, 2,5-di-t-butylhydroquinone, 4,4'-butylidenebis(3-methyl-6-t-butylphenol), 2,2'-methylenebis(4-methyl-6-t-butylphenol), 2,2'-methylenebis(4-ethyl-6-t-butylphenol), and ANTAGE W-500 (brand name, manufactured by Kawaguchi Chemical Industry Co., Ltd.). These compounds can be used either singularly, or in combinations of two or more different compounds.

There are no particular restrictions on the blend quantity of the component (D), and any quantity that provides an effective antioxidant action is suitable, although a typical quantity, calculated on the basis of mass relative to the combined mass of the component (A) and the component (B), is from 10 to 20,000 ppm, and particularly preferably from 100 to 1,000 ppm. By ensuring a blend quantity within this range, an effective antioxidant effect is produced, and a cured product can be obtained that displays excellent optical characteristics, with no coloring, turbidity, or oxidation deterioration.

[Component (E)]

A cured product produced from a composition of the present invention comprises platinum group metals such as platinum from the component (C). If this cured product is exposed to light over extended periods, or left sitting in a high temperature environment, then a problem arises in that the presence of the platinum group metal, particularly platinum, causes an interaction with the carbon-carbon double bonds that can result in coloring or turbidity of the product, or cause a deterioration in the strength and hardness due to oxidation deterioration. The hindered amine compound that represents the component (E) of a composition of the present invention performs the function of preventing this coloring and the like, and particularly in those cases where this component is added in combination with the aforementioned antioxidant (D), the photostability and thermal stability of a cured product produced from the composition of the present invention can be improved in a synergistic manner.

Specific examples of this component (E) include bis(2,2,6,6-tetramethyl-4-piperidyl) sebacate (brand name: Adeka Stab LA77Y, manufactured by Asahi Denka Co., Ltd.), bis(1-octyloxy-2,2,6,6-tetramethyl-4-piperidyl) sebacate (brand name: TINUVIN123, manufactured by Ciba Specialty Chemicals Inc.), 4-benzoyl-2,2,6,6-tetramethylpiperidine, the condensation polymerization product of dimethyl succinate and 1-(2-hydroxyethyl)-4-hydroxy-2,2,6,6-tetramethylpiperidine (brand name: TINUVIN622LD, manufactured by Ciba Specialty Chemicals Inc.), and poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] (brand names: CHIMASSORB 944 LD, CHIMASSORB 944 FD, manufactured by Ciba Specialty Chemicals Inc.). These compounds can be used either singularly, or in combinations of two or more different compounds.

There are no particular restrictions on the blend quantity of the component (E), and any effective quantity is suitable, although a typical quantity, calculated on the basis of mass relative to the combined mass of the component (A) and the component (B), is from 10 to 20,000 ppm, and particularly preferably from 100 to 1,000 ppm. By ensuring a blend quantity within this range, the cured product generated from the composition of the present invention can be imparted with superior photostability and thermal stability, enabling the production of a cured product with excellent optical characteristics that suffers no coloring, turbidity, or oxidation deterioration.

[Other Components]

In addition to the components (A) through (E) described above, other components may be added to a composition of the present invention, provided such addition does not impair the effects of the present invention.

For example, in order to adjust properties such as the viscosity of the composition or the hardness of the cured product, a silicon-based compound (F) containing a SiH group or an addition reactive carbon-carbon double bond, but different from the aforementioned components (A) and (B), can be added to the composition. Examples of this component (F) include straight chain diorganopolysiloxanes, network-type organopolysiloxanes, cyclic diorganopolysiloxanes or silphenylene-based compounds containing a single SiH group or addition reactive carbon-carbon double bond within each molecule, as well as silphenylene compounds represented by the structural formula shown below:

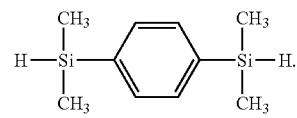

This component (F) may be used either singularly, or in combinations of two or more.

In those cases where the component (F) is added, (i) the blend quantity in those cases where the component (F) is a silicon-based compound containing a SiH group, is typically sufficient to provide no more than 20 mols, and preferably from 0.1 to 10 mols, of SiH groups within the component (F) per 1 mol of SiH groups within the aforementioned component (A).

Furthermore, (ii) the blend quantity in those cases where the component (F) is a silicon-based compound containing an addition reactive carbon-carbon double bond, is typically sufficient to provide no more than 20 mols, and preferably from 0.1 to 10 mols, of addition reactive carbon-carbon double bonds within the component (F) per 1 mol of addition reactive carbon-carbon double bonds within the aforementioned component (B).

In those cases where a combination of a silicon-based compound containing a SiH group, and a silicon-based compound containing an addition reactive carbon-carbon double bond is used as the component (F), the quantity of the silicon-based compound containing the SiH group should satisfy the condition (i) described above, and the quantity of the silicon-based compound containing an addition reactive carbon-carbon double bond should satisfy the condition (ii) described above.

Furthermore, as described above, the total quantity of SiH groups within the composition, relative to each mol of the combined total of addition reactive carbon-carbon double bonds within the composition, must typically be maintained within a range from 0.3 to 3.0 mols, and is preferably from 0.5 to 2.0 mols.

In a similar manner to that described above, other unreactive straight chain or cyclic diorganopolysiloxanes, or network-type organopolysiloxanes or silphenylene compounds or the like, which contain no SiH groups or addition reactive carbon-carbon double bonds, can also be added to the composition in order to adjust properties such as the viscosity of the composition or the hardness of the cured product.

Furthermore, in order to ensure the pot life, addition reaction control agents such as 1-ethynylcyclohexanol and 3,5-dimethyl-1-hexyn-3-ol may be added. In addition, inorganic fillers such as fumed silica may also be added to improve the strength, provided such addition does not impair the transparency, and where necessary, dyes, pigments, and flame retardants and the like may also be added.

Curing conditions for compositions of the present invention vary depending on the quantity of the composition, and although there are no particular restrictions, typical conditions preferably include a temperature of 60 to 180° C. and a curing time of 5 to 180 minutes.

[Sealing Material for Optical Semiconductor, Optical Semiconductor Device]

A composition of the present invention displays favorable adhesion, and generates a cured product with excellent optical characteristics such as transparency, transmittance of short wavelength light, and photostability, and is consequently very useful as a sealing material for optical semiconductors.

Examples of optical semiconductor devices to which a composition of the present invention is applied as a sealing material include light receiving elements such as photodiodes, phototransistors, and infrared detection elements; and light emitting elements such as LEDs. More specific examples include the various optical semiconductor devices used in autofocus components for cameras, optical pickups for CD/DVD, high-mount stop lights for vehicles, liquid crystal backlights for instrument panels or mobile phones, and light sources for television and air conditioning remote control units.

EXAMPLES

As follows is a specific description of the present invention, presenting a series of Examples and Comparative Examples, although the present invention is in no way limited to Examples presented below.

Synthesis Example 1

Preparation of Component (B2)

A 500 mL 4-neck flask equipped with a stirring device, a condenser tube, a dropping funnel and a thermometer was charged with 80 g of toluene and 115.2 g (0.48 mols) of 1,3,5,7-tetramethylcyclotetrasiloxane, and the flask was then heated to 117° C. using an oil bath. 0.05 g of carbon powder supporting 5% by mass of platinum metal was then added thereto, and with the mixture undergoing stirring, 48 g (0.4 mols) of vinylnorbornene (brand name: V0062, manufactured by Tokyo Kasei Kogyo Co., Ltd., an approximately equimolar isomeric mixture of 5-vinylbicyclo[2.2.1]hept-2-ene and 6-vinylbicyclo[2.2.1]hept-2-ene) was added dropwise over a period of 16 minutes. Following completion of the dropwise addition, the reaction mixture was further heated and stirred at 125° C. for 16 hours, and was then cooled to room temperature. Subsequently, the carbon supporting platinum metal was removed by filtration, and the toluene was removed under reduced pressure, yielding 152 g of a colorless, transparent, oily reaction product (viscosity at 25° C.: 2,500 mPa·s).

On the basis of the results of FT-IR, NMR and GPC analyses of this reaction product, it was confirmed as being a mixture of:

(1) compounds containing 1 tetramethylcyclotetrasiloxane ring: approximately 6 mol % (one example of a representative structural formula is shown below)

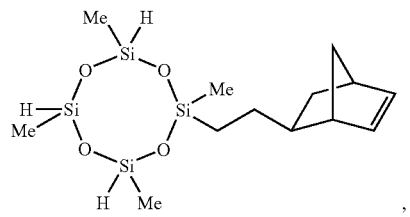

(2) compounds containing 2 tetramethylcyclotetrasiloxane rings: approximately 25 mol % (one example of a representative structural formula is shown below)

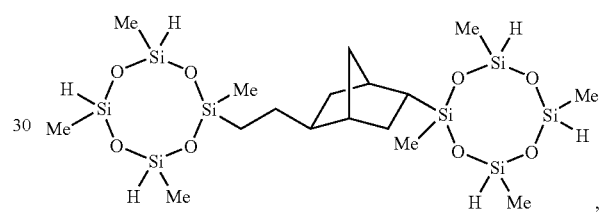

(3) compounds containing 3 tetramethylcyclotetrasiloxane rings: approximately 16 mol % (one example of a representative structural formula is shown below)

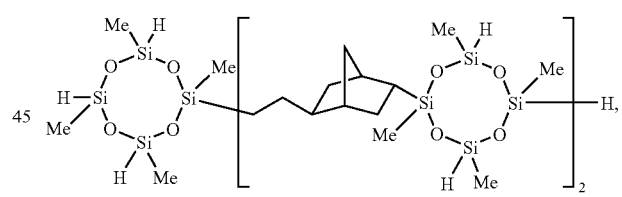

(4) compounds containing 4 tetramethylcyclotetrasiloxane rings: approximately 11 mol % (one example of a representative structural formula is shown below)

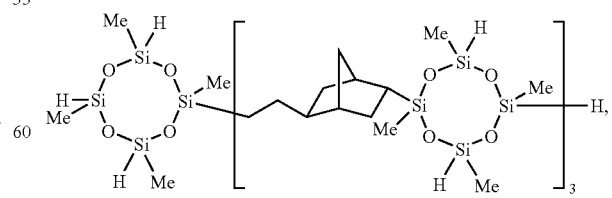

and (5) compounds containing from 5 to 12 tetramethylcyclotetrasiloxane rings: the remainder (one example of a representative structural formula is shown below)

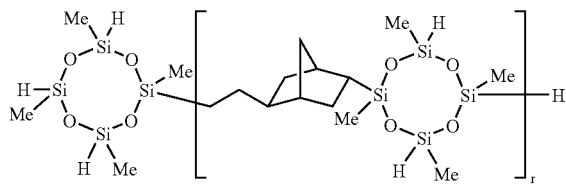

(wherein, r is an integer from 4 to 11).

The content of SiH groups within the total mixture was 0.63 mols/100 g.

Example 1

(A1) A three dimensional network-type organopolysiloxane (viscosity at 25° C.: 150,000 mPa·s) represented by an average composition formula (3) shown below:

$$(CH_3)_{0.70}(C_6H_5)_{0.55}(CH_2=CH)_{0.20}SiO_{1.28} \qquad (3)$$

and produced as a cohydrolysis-condensation product of phenyltrichlorosilane, methylvinyldichlorosilane, and dimethyldichlorosilane: 100 parts by mass, (B1) an organohydrogenpolysiloxane (viscosity at 25° C.: 20 mPa·s) represented by a structural formula (4) shown below:

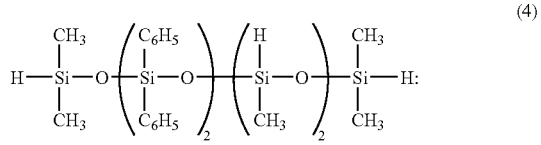

(4)

10 parts by mass, (F) a silphenylene-based compound represented by a structural formula (5) shown below:

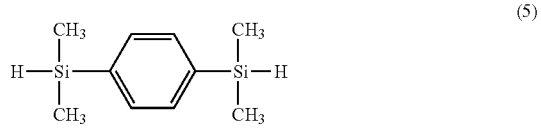

(5)

(wherein, SiH groups within (F)/SiH groups within (B1) (molar ratio)=1.69, and total SiH groups within (B1)+(F)/vinyl groups within (A1) (molar ratio)=0.88): 10 parts by mass, (C) an isopropanol solution of chloroplatinic acid: in sufficient quantity to provide 40 ppm of platinum metal atoms on the mass basis relative to the combined quantity of the components (A1) and (B1), (D1) 2,6-di-t-butyl-4-methylphenol: in sufficient quantity to provide 100 ppm on the mass basis relative to the combined quantity of the components (A1) and (B1), and (E1) bis(2,2,6,6-tetramethyl-4-piperidyl) sebacate (brand name: Adeka Stab LA77Y, manufactured by Asahi Denka Co., Ltd.): in sufficient quantity to provide 100 ppm on the mass basis relative to the combined quantity of the components (A1) and (B1) were mixed together uniformly to form a silicone resin composition. This silicone resin composition was defoamed, subsequently poured into a mold of thickness 4 mm, and dimensions 10 mm×100 mm, and was heated for 1 hour at 120° C., and then a further 1 hour at 150° C., thereby forming a cured product.

Example 2

(A2) A three dimensional network-type organopolysiloxane (viscosity at 25° C.: 120,000 mPa·s) represented by an average composition formula (4) shown below:

$$(CH_3)_{0.40}(C_6H_5)_{0.75}(CH_2=CH)_{0.40}(OH)_{0.13}SiO_{1.16} \qquad (4)$$

and produced as a cohydrolysis-condensation product of phenyltrichlorosilane, methylvinyldichlorosilane, and dimethyldichlorosilane: 100 parts by mass, the above component (B1): 10 parts by mass,
the above component (F) (wherein, SiH groups within (F)/SiH groups within (B1) (molar ratio)=4.24, and total SiH groups within (B1)+(F)/vinyl groups within (A2) (molar ratio)=0.98): 25 parts by mass,
the above component (C): in sufficient quantity to provide 40 ppm of platinum metal atoms on the mass basis relative to the combined quantity of the components (A2) and (B1),
(D2) 2,2'-methylenebis(4-ethyl-6-t-butylphenol): in sufficient quantity to provide 100 ppm on the mass basis relative to the combined quantity of the components (A2) and (B1), and
the above component (E1): in sufficient quantity to provide 100 ppm on the mass basis relative to the combined quantity of the components (A2) and (B1) were used, and a silicone resin composition and a cured product were prepared in the same manner as Example 1.

Example 3

The above component (A1): 100 parts by mass,
(B2) the siloxane-vinylnorbornene addition reaction product obtained in Synthesis Example 1 (wherein, SiH groups within (B2)/vinyl groups within (A1) (molar ratio)=1.01): 30 parts by mass,
the above component (C): in sufficient quantity to provide 40 ppm of platinum metal atoms on the mass basis relative to the combined quantity of the components (A1) and (B2),
the above component (D1): in sufficient quantity to provide 100 ppm on the mass basis relative to the combined quantity of the components (A1) and (B2), and
(E2) bis(1-octyloxy-2,2,6,6-tetramethyl-4-piperidyl) sebacate: in sufficient quantity to provide 100 ppm on the mass basis relative to the combined quantity of the components (A1) and (B2)
were used, and a silicone resin composition and a cured product were prepared in the same manner as Example 1.

[Comparative Example 1]

With the exception of not using the component (E1), a silicone resin composition and a cured product were prepared in the same manner as Example 1.

[Comparative Example 2]

With the exception of not using the component (D2), a silicone resin composition and a cured product were prepared in the same manner as Example 2.

[Comparative Example 3]

With the exception of not using the components (D1) and (E2), a silicone resin composition and a cured product were prepared in the same manner as Example 3.

<Performance Evaluation Methods>

(1) The performance of the cured products prepared in each of Examples and Comparative Examples described above was evaluated according to the following techniques.

-External Appearance-

The external appearance of each cured product was inspected visually. The results are shown in Table 1.

-Hardness-

The hardness (Shore D) of each cured product was measured in accordance with ASTM D 2240. The results of the measurements are shown in Table 1.

-Elastic Modulus-

A test specimen of dimensions 10 mm×100 mm was prepared from each 4 mm thick cured product, and the elastic modulus (MPa) of the test specimen was measured in accordance with JIS K-6911, using a 3 point bending test. The results of the measurements are shown in Table 1.

(2) Light Fastness Testing

Each cured product was irradiated with ultraviolet light (irradiation quantity: 80 mW/cm$^2$) using an Eye Super UV Tester W151 (product name, manufactured by Iwasaki Electric Co., Ltd., a metal halide lamp system), and the resulting Yellow Index value was measured using a color difference meter (300A type, manufactured by Nippon Denshoku Co., Ltd.). The results of these measurements, with increasing irradiation time, are shown in Table 2.

TABLE 1

| Item | Examples | | | Comparative Examples | | |
| --- | --- | --- | --- | --- | --- | --- |
| | 1 | 2 | 3 | 1 | 2 | 3 |
| External appearance | colorless transparent | colorless transparent | colorless transparent | colorless transparent | colorless transparent | colorless transparent |
| Hardness (Shore D) | 75 | 78 | 77 | 75 | 78 | 77 |
| Elastic modulus (MPa) | 1250 | 1310 | 1200 | 1250 | 1310 | 1200 |

TABLE 2

| | Examples | | | Comparative Examples | | |
| --- | --- | --- | --- | --- | --- | --- |
| Irradiation time (hr) | 1 | 2 | 3 | 1 | 2 | 3 |
| 0 | 1.9 | 2.0 | 2.0 | 1.9 | 2.0 | 2.0 |
| 100 | 2.4 | 2.6 | 2.4 | 4.0 | 5.1 | 6.3 |
| 250 | 2.5 | 2.7 | 2.6 | 5.1 | 7.3 | 8.6 |
| 500 | 2.5 | 2.7 | 2.6 | 6.2 | 8.8 | 9.5 |

[Evaluations]

From the results shown in Tables 1 and 2 it is evident that the cured products obtained from the compositions of Examples 1 through 3 are colorless and transparent, display excellent hardness and flexural strength (elastic modulus), and offer excellent photostability, being resistant to the irradiation of ultraviolet light over extended periods and undergoing no coloring.

In contrast, in the case of the cured products obtained from the compositions of Comparative Examples 1 through 3, which excluded the phenol-based antioxidant, the hindered amine compound, or both of these compounds, extended exposure to ultraviolet light irradiation caused coloring of the product, indicating inferior photostability.

What is claimed is:

1. A curable silicone resin composition comprising:
   (A) a siloxane-based compound containing at least 2 addition reactive carbon-carbon double bonds within each molecule,
   (B) a siloxane-based compound containing at least 2 hydrogen atoms bonded to silicon atoms within each molecule,
   (C) a hydrosilylation reaction catalyst,
   (D) a phenol-based antioxidant,
   (E) a hindered amine compound; and
   (F) a silicon-based compound containing a hydrogen atom bonded to a silicon atom, a silicon-based compound containing an addition reactive carbon-carbon double bond, or a mixture thereof, which is different from said component (A) and said component (B).

2. The composition according to claim 1, wherein said component (A) is a siloxane-based compound represented by an average composition formula (1) shown below:

$$R^1{}_m(C_6H_5)_n SiO_{[(4-m-n)/2]} \qquad (1)$$

{wherein, each $R^1$ group represents, independently, a substituted or unsubstituted monovalent hydrocarbon group other than a phenyl group, a group represented by a formula $R^2O-$ (wherein, $R^2$ is a substituted or unsubstituted monovalent hydrocarbon group), or a hydroxyl group, although from 0.1 to 80 mol % of all $R^1$ groups are alkenyl groups, m represents a number from 0.1 to 1.8, and n represents a number from 0.2 to 1.9, although $1 \leq m+n < 2$, and $0.20 \leq n/(m+n) \leq 0.95$}.

3. The composition according to claim 1, wherein said component (B) is (B1) a siloxane-based compound represented by an average composition formula (2) shown below:

$$R^3{}_a H_b SiO_{[(4-a-b)/2]} \qquad (2)$$

{wherein, each $R^3$ group represents, independently, a substituted or unsubstituted monovalent hydrocarbon group other than an aliphatic unsaturated hydrocarbon group, a represents a number from 0.5 to 2.1, b represents a number from 0.01 to 1.0, and a sum of a and b represents a number from 0.8 to 2.6}, (B2) a siloxane-based compound that is an addition reaction product of 5-vinylbicyclo[2.2.1]hept-2-ene, 6-vinylbicyclo[2.2.1]hept-2-ene, or a mixture thereof, with a cyclic siloxane compound containing from 3 to 10 hydrogen atoms bonded to silicon atoms within each molecule, or a combination of said siloxane-based compounds (B1) and (B2).

4. The composition according to claim 1, wherein a quantity of hydrogen atoms bonded to silicon atoms within said composition is within a range from 0.3 to 3.0 mols per 1 mol of addition reactive carbon-carbon double bonds within said composition.

5. The composition according to claim 1, wherein said component (D) is at least one compound selected from the group consisting of 2,6-di-t-butyl-4-methylphenol, 2,5-di-t-amylhydroquinone, 2,5-di-t-butylhydroquinone, 4,4'-butylidenebis(3-methyl-6-t-butylphenol), 2,2'-methylenebis(4-methyl-6-t-butylphenol), 2,2'-methylenebis(4-ethyl-6-t-butylphenol), and ANTAGE W-500.

6. The composition according to claim 1, wherein a quantity of said component (D) is within a range from 10 to 20,000 ppm on the mass basis relative to a combined quantity of said components (A) and (B).

7. The composition according to claim 1, wherein said component (E) is at least one compound selected from the group consisting of bis(2,2,6,6-tetramethyl-4-piperidyl) sebacate, bis(1-octyloxy-2,2,6,6-tetramethyl-4-piperidyl) sebacate, 4-benzoyl-2,2,6,6-tetramethylpiperidine, the condensation polymerization product of dimethyl succinate and 1-(2-hydroxyethyl)-4-hydroxy-2,2,6,6-tetramethylpiperidine, and poly[{6-(1,1,3,3-tetramethylbutyl)amino-1,3,5-triazine-2,4-diyl} {(2,2,6,6-tetramethyl-4-piperidyl)imino}hexamethylene{(2,2,6,6-tetramethyl-4-piperidyl)imino}].

8. The composition according to claim 1, wherein a quantity of said component (E) is within a range from 10 to 20,000 ppm on the mass basis relative to a combined quantity of said components (A) and (B).

9. A sealing material for an optical semiconductor comprising the composition according to claim 1.

10. An optical semiconductor device that has been sealed with a cured product of a curable silicone resin composition comprising:
   (A) a siloxane-based compound containing at least 2 addition reactive carbon-carbon double bonds within each molecule,
   (B) a siloxane-based compound containing at least 2 hydrogen atoms bonded to silicon atoms within each molecule,
   (C) a hydrosilylation reaction catalyst,
   (D) a phenol-based antioxidant,
   (E) a hindered amine compound.

11. An optical semiconductor device according to claim 10, wherein said component (A) is a siloxane-based compound represented by an average composition formula (1) shown below:

{wherein, each $R^1$ group represents, independently, a substituted or unsubstituted monovalent hydrocarbon group other than a phenyl group, a group represented by a formula $R^2O$— (wherein, $R^2$ is a substituted or unsubstituted monovalent hydrocarbon group), or a hydroxyl group, although from 0.1 to 80 mol % of all $R^1$ groups are alkenyl groups, m represents a number from 0.1 to 1.8, and n represents a number from 0.2 to 1.9, although $1 \leq m+n < 2$, and $0.20 \leq n/(m+n) \leq 0.95$}.

12. An optical semiconductor device according to claim 10, wherein said component (B) is (B1) a siloxane-based compound represented by an average composition formula (23) shown below:

{wherein, each $R^3$ group represents, independently, a substituted or unsubstituted monovalent hydrocarbon group other than an aliphatic unsaturated hydrocarbon group, a represents a number from 0.5 to 2.1, b represents a number from 0.01 to 1.0, and a sum of a and b represents a number from 0.8 to 2.6},
   (B2) a siloxane-based compound that is an addition reaction product of 5-vinylbicyclo[2.2.1]hept-2-ene, 6-vinylbicyclo[2.2.1]hept-2-ene, or a mixture thereof, with a cyclic siloxane compound containing from 3 to 10 hydrogen atoms bonded to silicon atoms within each molecule, or
   a combination of said siloxane-based compounds (B1) and (B2).

13. The optical semiconductor device according to claim 10, further comprising
   (F) a silicon-based compound containing a hydrogen atom bonded to a silicon atom, a silicon-based compound containing an addition reactive carbon-carbon double bond, or a mixture thereof, which is different from said component (A) and said component (B).

14. The optical semiconductor device according to claim 10, wherein a quantity of hydrogen atoms bonded to silicon atoms within said composition is within a range from 0.3 to 3.0 mols per 1 mol of addition reactive carbon-carbon double bonds within said composition.

15. The optical semiconductor device according to claim 10, wherein said component (D) is at least one compound selected from the group consisting of 2,6-di-t-butyl-4-methylphenol, 2,5-di-t-amylhydroquinone, 2,5-di-t-butylhydroquinone, 4,4'-butylidenebis(3-methyl-6-t-butylphenol), 2,2'-methylenebis(4-methyl-6-t-butylphenol), 2,2'-methylenebis(4-ethyl-6-t-butylphenol), and ANTAGE W-500.

16. The optical semiconductor device according to claim 10, wherein a quantity of said component (D) is within a range from 10 to 20,000 ppm on the mass basis relative to a combined quantity of said components (A) and (B).

17. The optical semiconductor device according to claim 10, wherein said component (B) is at least one compound selected from the group consisting of bis(2,2,6,6-tetramethyl-4-piperidyl) sebacate, bis(1-octyloxy-2,2,6,6-tetramethyl-4-piperidyl) sebacate, 4-benzoyl-2,2,6,6-tetramethylpiperidine, the condensation polymerization product of dimethyl succinate and 1-(2-hydroxyethyl)-4-hydroxy-2,2,6,6-tetramethylpiperidine, and poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}].

18. The optical semiconductor device according to claim 10, wherein a quantity of said component (E) is within a range from 10 to 20,000 ppm on the mass basis relative to a combined quantity of said components (A) and (B).

* * * * *